(12) United States Patent
Khan et al.

(10) Patent No.: US 12,061,313 B2
(45) Date of Patent: *Aug. 13, 2024

(54) DIAMOND COATED ANTIREFLECTIVE WINDOW SYSTEM AND METHOD

(71) Applicant: AKHAN Semiconductor, Inc., Gurnee, IL (US)

(72) Inventors: Adam Khan, San Francisco, CA (US); Robert Polak, Lindenhurst, IL (US)

(73) Assignee: AKHAN SEMICONDUCTOR, INC., Gurnee, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/310,882

(22) Filed: May 2, 2023

(65) Prior Publication Data

US 2023/0273346 A1   Aug. 31, 2023

Related U.S. Application Data

(60) Continuation of application No. 17/399,902, filed on Aug. 11, 2021, which is a continuation of application
(Continued)

(51) Int. Cl.
*G02B 1/115* (2015.01)
*C23C 14/06* (2006.01)
*C23C 28/00* (2006.01)

(52) U.S. Cl.
CPC ............. *G02B 1/115* (2013.01); *C23C 14/06* (2013.01); *C23C 28/322* (2013.01); *C23C 28/34* (2013.01); *C23C 28/345* (2013.01)

(58) Field of Classification Search
CPC ........... G02B 1/14; G02B 1/115; G02B 1/111; G02B 1/11; G02B 1/113; G02B 1/118;
(Continued)

(56) References Cited

U.S. PATENT DOCUMENTS 4,907,846 A * 3/1990 Tustison ................ G02B 1/115
359/359
5,425,983 A * 6/1995 Propst .................... G02B 1/115
428/408
(Continued)

FOREIGN PATENT DOCUMENTS

EP            1698713 A1 * 9/2006 ......... C23C 16/0272

*Primary Examiner* — Ephrem Z Mebrahtu
(74) *Attorney, Agent, or Firm* — David R. Stevens; Stevens Law Group

(57) ABSTRACT

A system and method for diamond based multilayer antireflective coating for optical windows are provided. An antireflective coatings for optical windows may include an optical grade silicon substrate, a first polycrystalline diamond film on the silicon substrate, a germanium film on the first polycrystalline diamond film, a fused silica film on the germanium film; and a second polycrystalline diamond film on the fused silica film. A method of fabricating a diamond based multilayer antireflective coating may include the steps of cleaning and seeding an optical substrate, forming a first diamond layer on the optical substrate, forming a germanium layer on the first diamond layer, forming a fused silica layer on the germanium layer, cleaning and seeding the germanium layer, and forming a second diamond layer on the germanium layer.

20 Claims, 2 Drawing Sheets

Related U.S. Application Data

No. 16/579,742, filed on Sep. 23, 2019, now Pat. No. 11,112,539, which is a division of application No. 15/447,032, filed on Mar. 1, 2017, now Pat. No. 10,422,928.

(60) Provisional application No. 62/301,746, filed on Mar. 1, 2016.

(58) Field of Classification Search
CPC ... G02B 1/02; G02B 1/10; G02B 1/18; G02B 5/208; G02B 5/281; C23C 28/343; C23C 28/345; C23C 28/34; C23C 28/322; C23C 14/06

See application file for complete search history.

(56) References Cited

U.S. PATENT DOCUMENTS

| | | | | |
|---|---|---|---|---|
| 5,472,787 A | * | 12/1995 | Johnson | C23C 14/024 359/359 |
| 5,643,423 A | * | 7/1997 | Kimock | C03C 17/3452 427/249.7 |
| 2008/0239488 A1 | * | 10/2008 | Asakura | G02B 1/111 349/96 |

* cited by examiner

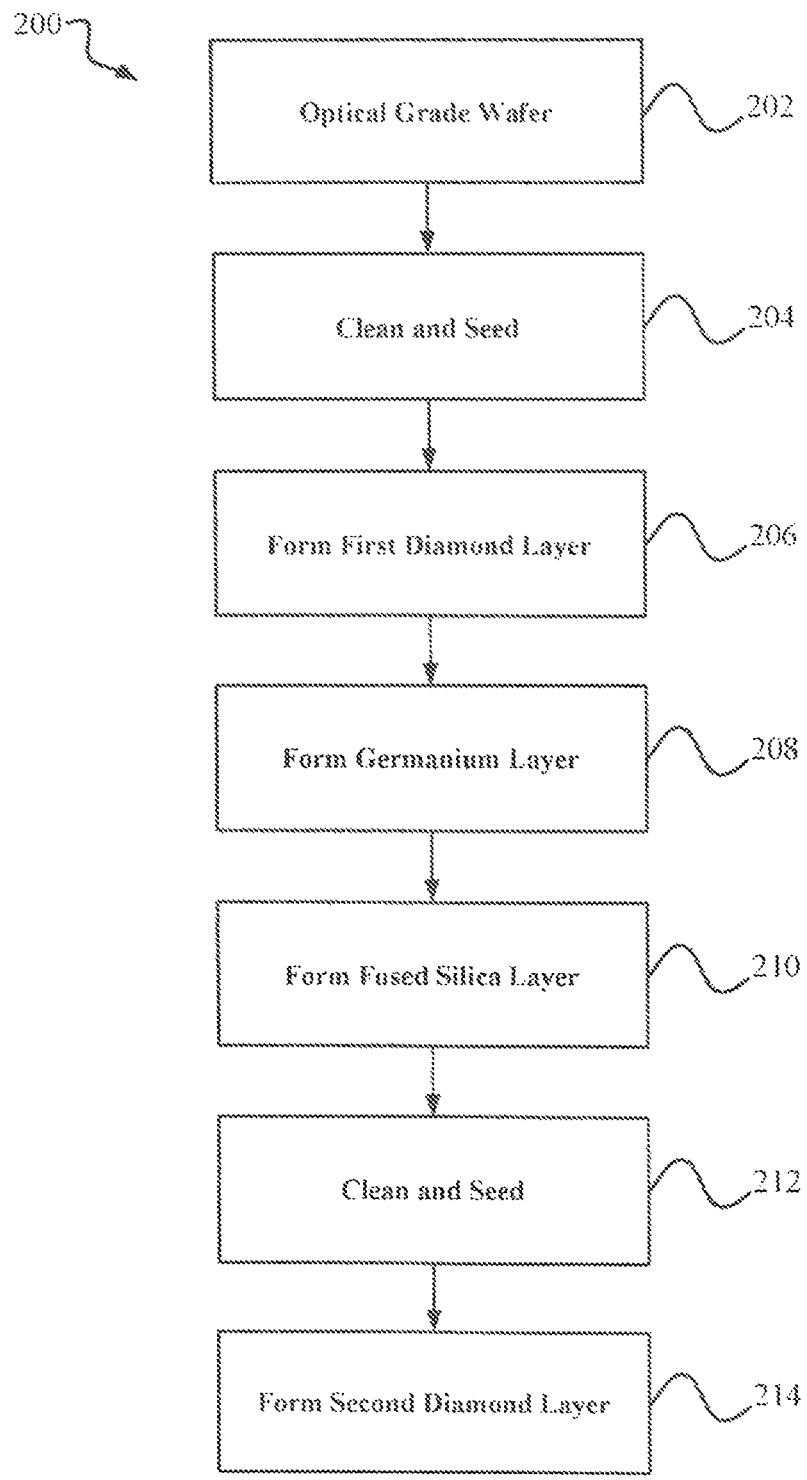

DIAMOND COATED ANTIREFLECTIVE WINDOW SYSTEM AND METHOD

CROSS-REFERENCE TO RELATED APPLICATION

This application is a continuation of U.S. patent application Ser. No. 17/399,902, filed Aug. 11, 2021, which is a continuation of U.S. patent application Ser. No. 16/579,742, filed Sep. 23, 2019, which is divisional of U.S. patent application Ser. No. 15/447,032, filed Mar. 1, 2017, which claims the benefit of U.S. Provisional Patent Application Ser. No. 62/301,746, filed Mar. 1, 2016, all of which are hereby incorporated herein by reference.

FIELD

This invention is generally related to systems and methods for antireflective coatings for optical windows, and more particularly to a system and method for providing diamond based multilayer antireflective coating for optical windows.

BACKGROUND

Diamond possesses favorable theoretical semiconductor performance characteristics, including the possibility of creating transparent electronics, including those related to optical windows. However, practical diamond based semiconductor device applications for optical windows remain limited.

SUMMARY

Disclosed herein is a new and improved system and method for diamond based multilayer antireflective coating for optical windows. In accordance with one aspect of the approach, a system for antireflective coatings for optical windows may include an optical grade silicon substrate, a first polycrystalline diamond film on the silicon substrate, a germanium film on the first polycrystalline diamond film, a fused silica film on the germanium film; and a second polycrystalline diamond film on the fused silica film.

In another approach, a method of fabricating a transparent electronic device, may include the steps of cleaning and seeding an optical substrate, forming a first diamond layer on the optical substrate, forming a germanium layer on the first diamond layer, forming a fused silica layer on the germanium layer, cleaning and seeding the germanium layer, and forming a second diamond layer on the germanium layer.

Other systems, methods, aspects, features, embodiments and advantages of the system and method disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the system disclosed herein. In the Figures, like reference numerals designate corresponding parts throughout the different views.

FIG. 2 a block diagram of an embodiment of a method for fabricating a monolithically integrated antireflective coating thin film structure, such as the structure of FIG. 1.

DETAILED DESCRIPTION

Figure 1:
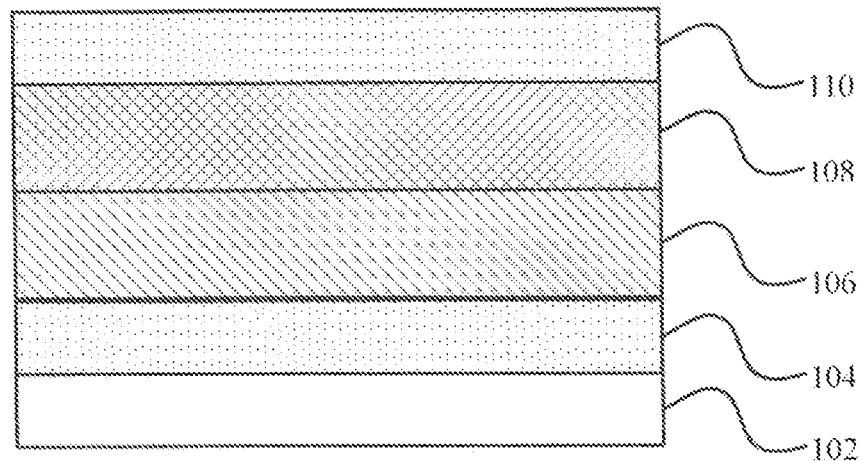
FIG. 1 is schematic diagram of an exemplary monolithically integrated antireflective coating thin film structure.

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

Prior medium wavelength infrared antireflective coatings may suffer from delamination, degradation, and fluctuating optical transmissivity. Nanocrystalline diamond may provide high transmissivity infrared windows with high reliability. Semiconductor grade nanocrystalline diamond material is effective in optical display applications, particularly in tandem with fused silica thin films. Multilayer film synthesis provides nanocrystalline diamond based antireflective coatings fabrication which is beneficial for use in medium wavelength infrared applications, for example in wavelength applications from 3.0 micrometers to 5.0 micrometers.

Single layer antireflective coatings may minimize the reflectance, but may reduce it to zero only for a certain value of film refractive index. A multi-layer antireflective coating deposited on a substrate may reduce the reflectance from the substrate to zero for a certain wavelength range. Optical grade silicon may have an index of refraction (n) of approximately 3.4, Lower value index of refraction diamond (n=2.4) may be incorporated with optical materials of higher and lower indices of refraction, such as germanium (n=4.0) and fused silica (n=1.4), respectfully, to produce near zero reflectance at infrared wavelengths for certain values of film thicknesses. Utilizing optical design programs, such as open-source software for the design, optimization, and synthesis of optical filters, for example, Openfilters, with inputs optimized for the medium wavelength infrared range, high transmittance at a variety of critical angles may be realized via a 4-layer antireflective coating consisting of an optical substrate Silicon, a first antireflective coating film layer of nanocrystalline diamond, a second antireflective coating film layer of germanium, a third antireflective coating film layer of fused silica, and a antireflective coating film layer of nanocrystalline diamond with film thicknesses of approximately 104 nm, 595 nm, 432 nm and 115 nm, respectfully. Further, utilizing this modality, the hydrophobicity and scratch resistance of diamond may enhance the performance of connecting fused silica layer, as water accumulation is known to cause absorption of light in fused silica systems.

Diamond layers may provide advantageous such as ultra-hardness, scratch-resistance, high thermal conductivity, hydrophobicity, chemical and biological inertness, amongst others. In part, due to difficulty in fabricating high quality thin films cost efficiently, diamond has traditionally not been used for infrared optical window applications due to diamond's sharp and semi-sharp absorption spectra in the medium wavelength infrared region. However, through novel multilayer combination with optical materials of larger and smaller refractive index values, it is now possible to capture the favorable material properties of diamond in antireflective coatings for medium wavelength infrared optical window applications. The disclosed systems may provide a more rugged system for various applications, such as for battlefield applications. This disclosure provides several preferred embodiments of fabrication, however, the performance characteristics and materials characteristics described in this application are not necessarily performance bounds or limitations of the invention. These disclosures merely demonstrate some aspects of the invention that have presently been tested.

FIG. 1 shows a schematic diagram of an exemplary monolithically integrated antireflective coating thin film structure 100. Structure 100 may include a substrate 102, a first diamond thin film 104, a germanium film 106, a fused silica film 108, and a second diamond thin film 110. Substrate 102 may be an optical grade substrate, such as, but not limited to an optical grade silicon substrate. Diamond thin films 104 and 110 may be polycrystalline diamond thin films. Film structure 100 is shown as an exemplary composite film structure and exemplary sequence for a diamond based multilayer antireflective coating for infrared optical windows.

In one embodiment, the second diamond thin film 110 may be 115 nanometers, the fused silica film 108 may be 432 nanometers, the germanium film 106 may be 595 nanometers, and the first diamond thin film 104 may be 104-105 nanometers. In another embodiment, the first polycrystalline diamond film 104 may be between 100 and 110 nanometers, the germanium film 106 may be between 590 and 600 nanometers, the fused silica film 108 may be between 427 and 437 nanometers, and the second polycrystalline diamond film 110 is between 110 and 120 nanometers FIG. 2 shows a block diagram of an embodiment of a method 200 for fabricating a fabricating a diamond based multilayer antireflective coating, such as exemplary monolithically integrated antireflective coating thin film structure 100. Fabrication of such a system can be realized utilizing a combination of chemical vapor deposition, physical vapor deposition, and reactive ion etching systems.

Method 200 may include a first step 202 of selecting an optical substrate, such as an optical grade silicon wafer, for example, substrate 102. Method 200 may include a second step 204 of cleaning and seeding the optical grade silicon wafer of first step 202. For example, step 204 may include exposing the optical grade silicon wafer to an acid cleaning mixture, such as (4:1 H.sub.2SO.sub.4/H.sub.2O.sub.2, H.sub.2O.sub.2, 5:1:1 H.sub.2O/H.sub.2O.sub.2/HCl). Step 204 may also include seeding the optical grade silicon wafer with a nanoseed solution mixture and ultrasoniced in alcohol solution to promote nucleation and film agglomeration.

Method 200 may include a step 206 of forming a first diamond layer. Step 206 may include chemical vapor deposition growth and etching of the diamond layer. Step 206 may include exposing the wafer of step 204 to a methane, argonne, and hydrogen plasma gas mixture in a chemical vapor deposition system to produce the a thin nanocrystalline diamond film, for example, the first diamond thin film 104. In the event the diamond growth is beyond the target thickness, reactive ion etching via an argonne and oxygen mixture may produce bulk planarized uniform diamond films.

Method 200 may include a step 208 of forming a germanium layer. Step 208 may include sputtering physical vapor deposition and etching. Step 208 may include high purity germanium targets properly loaded into a magnetron sputtering physical vapor deposition system to produce germanium film, such as, for example, germanium film 106. Step 208 may include ion milling in the event the germanium growth is beyond the desired thickness.

Method 200 may include a step 210 of forming a fused silica film. Step 210 may include sputtering physical vapor deposition and etching. Step 210 may include a high purity fused silica target loaded into a sputtering physical vapor deposition system to produce fused silica films, such as, for example, the fused silica film 108. Step 210 may also include ion milling in the event of fused silica growth is beyond the desired thickness.

Method 200 may include a step 212 of cleaning and seeding. Step 212 may include cleaning the product of prior steps with an ultrasonic bath. Step 212 may include seeding with nanocrystalline diamond seed solution and ultrasoniced with an alcohol solution mixture Method 200 may include a step 214 of forming a second diamond layer. Step 214 may include chemical vapor deposition growth and etching of the diamond layer to produce a nanocrystalline diamond film, for example, the second diamond thin film 110.

The commercially available optics design software suite, Open Filters, was utilized to simulate the transmittance of the proposed system. Embodiments of the system and method were shown to have beneficial transmissivity in the infrared spectrum ranges between 3700 nanometers and 4900 nanometers in wavelength with transmittance shown to be in excess of 9.4% at critical incident angles of 0.degree., 15.degree., 30.degree., and 45.degree.

Structure 100 and method 200 may incorporate systems and methods previously disclosed and described in U.S. Patent Publication No. 2013/0026492, by Adam Khan, published on Jan. 31, 2013; U.S. Pat. No. 8,354,290, issued to Anirudha Sumant, et al, on Jan. 15, 2013; U.S. Pat. No. 8,933,462, issued to Adam Khan on Jan. 13, 2015; U.S. Patent Publication No. 2015/0206749, by Adam Khan, published on Jul. 23, 2015, and U.S. Patent Publication No. 2015/0295134, by Adam Khan, et al, published on Oct. 15, 2015, all of which are fully incorporated herein by reference.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

The invention claimed is:

1. A multilayer antireflective coating for an optical substrate, comprising:
  a scratch resistant first nanocrystalline diamond film; and
  a plurality of layers positioned between the scratch resistant first nanocrystalline diamond film and the optical substrate, wherein the plurality of layers includes a high refractive index film with an index of refraction greater than 3.4, a fused silica film, and a second nanocrystalline diamond film applied onto the optical substrate.

2. The multilayer antireflective coating for the optical substrate of claim 1, wherein the optical substrate is an optical grade silicon substrate.

3. The multilayer antireflective coating for the optical substrate of claim 1, wherein the optical substrate allows transmission of infrared light.

4. The multilayer antireflective coating for the optical substrate of claim 1, wherein the multilayer antireflective coating and the optical substrate together allow transmission of infrared light at infrared spectrum lengths between 3700 and 4900 nanometers.

5. The multilayer antireflective coating for the optical substrate of claim 1, wherein the multilayer antireflective coating and the optical substrate together allow transmission of infrared light for an infrared spectrum lengths between 3700 and 4900 nanometers at a transmittance in excess of 94% at incident angles of 0 degrees, 15 degrees, 30 degrees, and 45 degrees.

6. The multilayer antireflective coating for the optical substrate of claim 1, wherein the high refractive index film with an index of refraction greater than 3.4 comprises germanium.

7. The multilayer antireflective coating for the optical substrate of claim 1, wherein the high refractive index film with an index of refraction greater than 3.4 has a film thickness of less than 600 nanometers.

8. The multilayer antireflective coating for the optical substrate of claim 1, wherein the high refractive index film with an index of refraction greater than 3.4 is formed by sputtering physical vapor deposition.

9. The multilayer antireflective coating for the optical substrate of claim 1, wherein the fused silica film has a refractive index of 1.4.

10. The multilayer antireflective coating for the optical substrate of claim 1, wherein the fused silica film has a film thickness between 427 and 437 nanometers.

11. The multilayer antireflective coating for the optical substrate of claim 1, wherein the fused silica film is formed by sputtering physical vapor deposition.

12. The multilayer antireflective coating for the optical substrate of claim 1, wherein the second nanocrystalline diamond film has a film thickness of less than 110 nanometers.

13. The multilayer antireflective coating for the optical substrate of claim 1, wherein the second nanocrystalline diamond film has a film thickness between 100 and 110 nanometers.

14. The multilayer antireflective coating for the optical substrate of claim 1, wherein the scratch resistant first nanocrystalline diamond film has a film thickness of less than 120 nanometers.

15. The multilayer antireflective coating for the optical substrate of claim 1, wherein the scratch resistant first nanocrystalline diamond film has a film thickness of greater than 110 nanometers.

16. The multilayer antireflective coating for the optical substrate of claim 1, wherein at least one of the second nanocrystalline diamond film and scratch resistant first nanocrystalline diamond film is polycrystalline.

17. A method of forming a multilayer antireflective coating on an optical substrate, comprising the steps of:
applying multiple layers onto a substrate, with at least two of the multiple layers comprising a high refractive index film with an index of refraction greater than 3.4, and a first nanocrystalline diamond film applied onto the optical substrate; and
forming a scratch resistant second nanocrystalline diamond film on the multiple layers.

18. The method of forming a multilayer antireflective coating on the optical substrate of claim 17, wherein the optical substrate is an optical grade silicon substrate.

19. The method of forming a multilayer antireflective coating on the optical substrate of claim 17, wherein the optical substrate allows transmission of infrared light.

20. The method of forming a multilayer antireflective coating on the optical substrate of claim 17, wherein at least one of the first nanocrystalline diamond film and scratch resistant second nanocrystalline diamond film is polycrystalline.

\* \* \* \* \*